US008730289B2

(12) United States Patent
Sakurai

(10) Patent No.: US 8,730,289 B2
(45) Date of Patent: May 20, 2014

(54) LIGHT EMISSION APPARATUS, OPTICAL SCANNING APPARATUS INCLUDING THE LIGHT EMISSION APPARATUS, AND IMAGE FORMING APPARATUS INCLUDING THE OPTICAL SCANNING APPARATUS

(75) Inventor: Yuuta Sakurai, Toride (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/536,574

(22) Filed: Jun. 28, 2012

(65) Prior Publication Data

US 2013/0002792 A1   Jan. 3, 2013

(30) Foreign Application Priority Data

Jun. 30, 2011   (JP) ................................. 2011-146192

(51) Int. Cl.
*B41J 2/45*   (2006.01)
(52) U.S. Cl.
USPC ........................................................ 347/238
(58) Field of Classification Search
USPC .................. 347/238, 242, 257, 263
See application file for complete search history.

(56) References Cited

U.S. PATENT DOCUMENTS 8,339,435 B2 *  12/2012  Yamakawa et al. ........... 347/263
2011/0115869 A1   5/2011  Nakaie

FOREIGN PATENT DOCUMENTS

| JP | 2009-187028 A |   | 8/2009 |   |
|---|---|---|---|---|
| JP | 2009187028 A | * | 8/2009 | ............ G02B 26/10 |
| JP | 2010-175712 A |   | 8/2010 |   |
| JP | 2011-035099 A |   | 2/2011 |   |
| JP | 2011035099 A | * | 2/2011 | ............ H01S 5/022 |

* cited by examiner

*Primary Examiner* — Hai C Pham
(74) *Attorney, Agent, or Firm* — Canon USA Inc. IP Division

(57) ABSTRACT

In a light emission apparatus which is connected to a board to which a VCSEL is bonded, and to a laser holder and which is configured to bring the VCSEL on the board into contact with a contact portion provided on the laser holder, through elastic deformation, the board is deformed due to fluctuations in the state of elastic deformation of a connection member, and electrical connection with the VCSEL is cut off by this deformation wherein a plate spring configured to press the connection member toward the laser holder side is provided.

12 Claims, 10 Drawing Sheets

LIGHT EMISSION APPARATUS, OPTICAL SCANNING APPARATUS INCLUDING THE LIGHT EMISSION APPARATUS, AND IMAGE FORMING APPARATUS INCLUDING THE OPTICAL SCANNING APPARATUS

BACKGROUND OF THE INVENTION

1. Field of the Invention

The present invention relates to a light emission apparatus configured to emit a light beam, an optical scanning apparatus including the light emission apparatus, and an image forming apparatus including with the optical scanning apparatus.

2. Description of the Related Art

In an image forming apparatus such as an electrophotographic copying machine or printer, scanning is performed on a photosensitive member with a light beam such as a laser beam to form an electrostatic latent image on the photosensitive member, and the electrostatic latent image is developed with toner to form an image. A light emission apparatus such as an optical scanning apparatus is used as the apparatus for emitting the laser beam with which the photosensitive member is exposed.

In the above-mentioned optical scanning apparatus, light from a semiconductor laser serving as the light source is converted to substantially parallel light to be deflected by a rotating polygon mirror (hereinafter simply referred to as the polygon mirror). Scanning is performed on the photosensitive member in a substantially linear fashion with the laser beam deflected by the rotating polygon mirror.

To keep up with recent increasing demand in image forming speed and in image resolution, optical scanning apparatuses nowadays perform exposure on the photosensitive member with a plurality of laser beams emitted from a plurality of light emission points. In particular, a vertical cavity surface emitting laser (VCSEL) is adopted as the light source of an optical scanning apparatus since it allows easy arrangement of a large number of light emission points.

In an optical scanning apparatus, the optical path of the light beam emitted from the light source affects the laser beam configuration on the photosensitive member, the image forming position of the laser beam, and the light quantity, so that it is necessary to maintain a high installation precision for the light source components such as a lens and mirror. In the case where a VCSEL is used as the light source, exposure is performed on the photosensitive member with a laser beam passing the vicinity of the optical axis of the lens such as a collimator lens, and a laser beam passing portion separate from the optical axis of the lens.

Strictly speaking, the optical performance of the optical axis portion of a lens and the optical performance of a portion separate from the optical axis are different. The optical performance of a lens is the highest at the optical axis portion.

When the positional precision of the VCSEL is low, the positional relationship between the lens and the VCSEL is not ideal, so that the laser beam passes a position further separate from the optical axis of the lens than the position of the design value. Such a laser beam does not have desired characteristics in terms of the light quantity on the photosensitive member, spot configuration, etc., which may lead to deterioration in image quality. Thus, enhancement of the positional precision (installation precision) of the VCSEL is required.

Japanese Patent Application Laid-Open No. 2009-187028 discusses an optical scanning apparatus which provides on the upper surface of the package of a VCSEL a reference surface (contact portion) parallel to the flat surface on which the light emission points are placed, and which mounts on the board a connection member provided between an optical unit and a board on which the VCSEL package is disposed such that the connection member bends in the optical axis direction.

In the optical scanning apparatus discussed in Japanese Patent Application Laid-Open No. 2009-187028, the VCSEL package reference surface is brought into contact with the reference surface on the optical unit side by a restoring force generated in the connection member. Thus, high precision can be secured in terms of the verticality of the optical axis and the VCSEL package.

However, as illustrated in FIG. 10, in the light emission apparatus mounting structure discussed in Japanese Patent Application Laid-Open No. 2009-187028, a connection member 1002 connected to a laser holder bends a board 1003 in an archlike manner so as to make it convex on the side of the surface on which a VCSEL package 1004 is mounted. As a result, warpage is also generated in the board 1003 in the same direction and to the same degree, generating a great stress at a solder bonding portion for electrically connecting and holding the VCSEL package 1004 and the board 1003.

SUMMARY OF THE INVENTION

According to an aspect of the present invention, a light emission apparatus includes a light emission unit including a board having a first electrode, a second electrode connected to the first electrode, and a light source configured to emit a light beam based on an electric signal transmitted from the first electrode to the second electrode, a holding member including a contact portion contacting the emission unit; a connection member disposed between the board and the holding member and configured to connect the holding member and the board in an elastically deformed state, wherein the emission unit connected to the connection member contacts with the contact portion of the holding member connected to the connection member, by a restoring force generated through the elastic deformation of the connection member, and a pressing member configured to press the connection member toward the holding member.

Further features and aspects of the present invention will become apparent from the following detailed description of embodiments with reference to the attached drawings.

BRIEF DESCRIPTION OF THE DRAWINGS

The accompanying drawings, which are incorporated in and constitute a part of the specification, illustrate embodiments, features, and aspects of the invention and, together with the description, serve to explain the principles of the invention.

DESCRIPTION OF THE EMBODIMENTS

Various embodiments, features, and aspects of the invention will be described in detail below with reference to the drawings. Each of the embodiments of the present invention described below can be implemented solely or as a combination of a plurality of the embodiments or features thereof where necessary or where the combination of elements or features from individual embodiments in a single embodiment is beneficial.

The dimensions, materials, configurations, relative arrangement, etc. of the components discussed in this embodiment are modified as appropriate according to various conditions and the construction of the apparatus to which the present invention is applied. They are not intended to restrict the scope of this invention to the embodiment described below.

Figure 1:
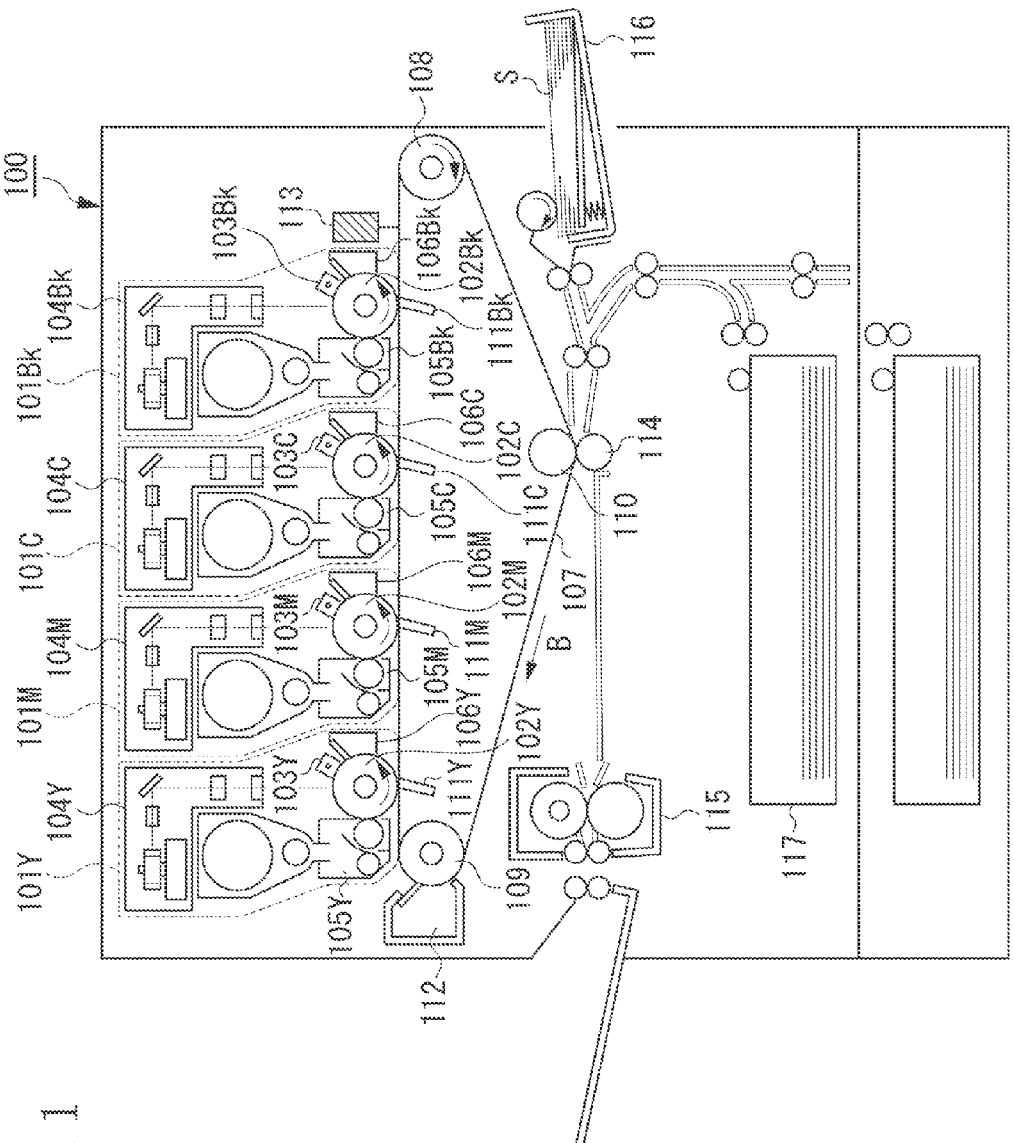
FIG. 1 is a diagram schematically illustrating an image forming apparatus.
Figure 2:
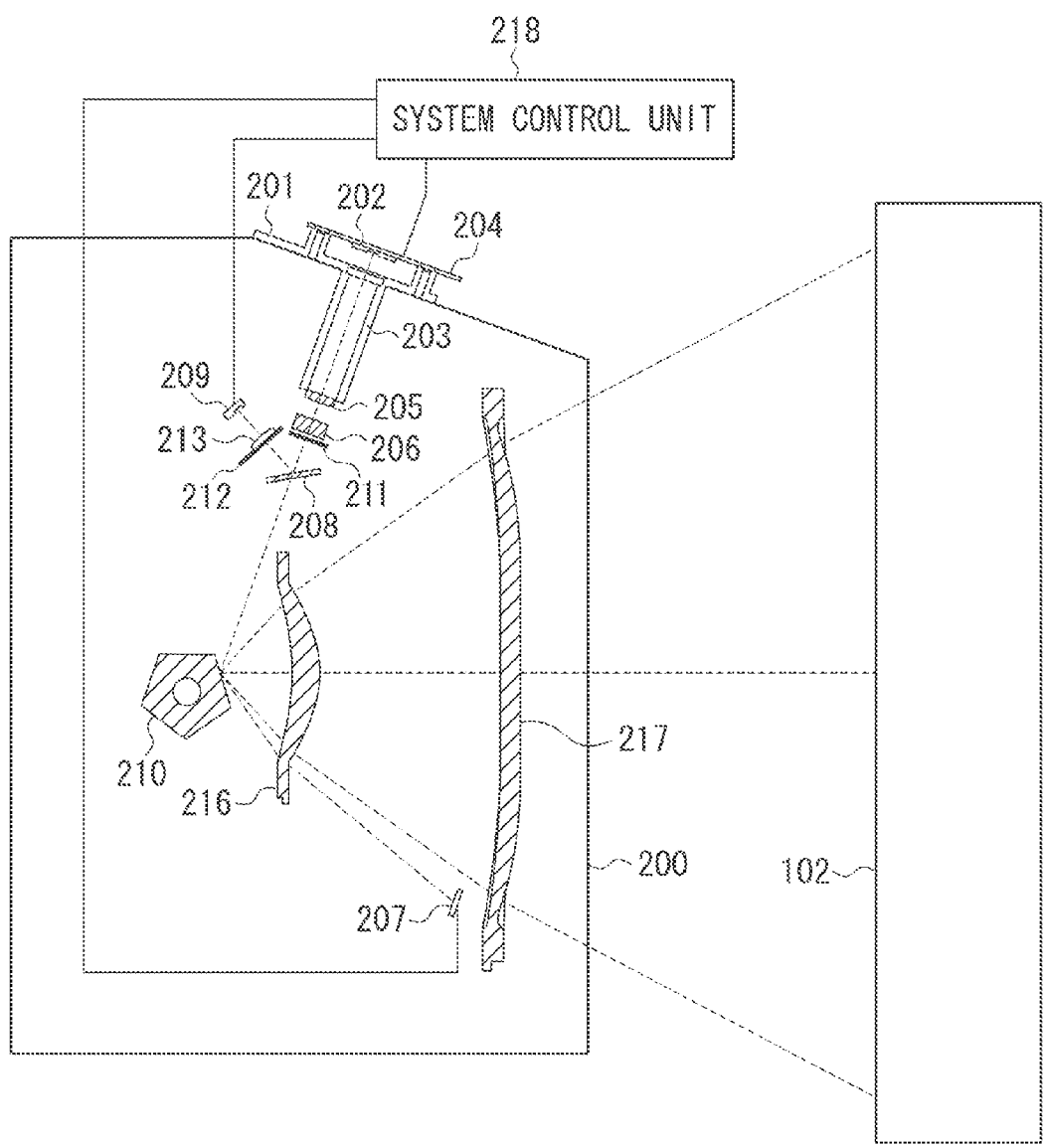
FIG. 2 is a diagram schematically illustrating an optical scanning apparatus.

FIG. 1 is a schematic diagram illustrating a digital full color printer (color image forming apparatus) configured to perform image formation using toner of a plurality of colors. FIG. 2 is an expanded schematic view of an optical scanning apparatus constituting an optical beam emission apparatus provided in the digital full color copying machine illustrated in FIG. 1.

Although in the illustration of the embodiment a color image forming apparatus and an optical scanning apparatus provided therein are described as an example, the present embodiment is not restricted to a color image forming apparatus and an optical scanning apparatus provided therein but is also applicable to an image forming apparatus configured to perform image formation solely with toner of a single color (e.g., black) and an optical scanning apparatus provided therein.

First, an image forming apparatus 100 according to the present embodiment will be described with reference to FIG. 1. Inside the image forming apparatus 100, four image forming units 101Y, 101M, 101C, and 101Bk are arranged to form images in different colors. Y, M, C, and Bk respectively indicate yellow, magenta, cyan, and black. The image forming units 101Y, 101M, 101C, and 101Bk perform image formation by using yellow, magenta, cyan, and black toners, respectively.

The image forming units 101Y, 101M, 101C, and 101Bk are equipped with photosensitive drums 102Y, 102M, 102C, and 102Bk as the members to be exposed. Around the photosensitive drums 102Y, 102M, 102C, and 102Bk, there are respectively provided charging devices 103Y, 103M, 103C, and 103Bk; optical scanning devices 104Y, 104M, 104C, and 104Bk; and developing devices 105Y, 105M, 105C, and 105Bk. Further, around the photosensitive drums 102Y, 102M, 102C, and 102Bk, there are arranged drum cleaning devices 106Y, 106M, 106C, and 106Bk.

Under the photosensitive drums 102Y, 102M, 102C, and 102Bk, an intermediate transfer belt 107 is arranged in the form of an endless belt. The intermediate transfer belt 107, which is stretched between a driving roller 108 and driven rollers 109 and 110, rotates in the direction of the arrow in the diagram during image formation. Further, primary transfer devices 111Y, 111M, 111C, and 111Bk are provided at positions facing the photosensitive drums 102Y, 102M, 102C, and 102Bk through the intermediation of the intermediate transfer belt 107 (intermediate transfer member). Further, in the vicinity of the intermediate transfer belt 107, there are provided a cleaning device 112 for removing residual toner on the belt, and a sensor 113 (detection unit) for reading a predetermined image pattern for detecting the deviation amount of the toner image of each color.

The image forming apparatus 100 according to the present embodiment is equipped with a secondary transfer device 114 for transferring the toner images on the intermediate transfer belt 107 onto a recording medium S, and a fixing device 115 for fixing the toner images on the recording medium S.

The image forming process of the image forming apparatus 100, constructed as illustrated above, will be described. Since the same image forming process is performed at each image forming unit, the image forming process will be described solely with reference to the image forming unit 101Y, and description of the image forming process at the image forming units 101M, 101C, and 101Bk will be omitted.

First, the photosensitive drum 102Y is charged by the charging device of the image forming unit 101Y. The laser beam emitted from the light source such as a semiconductor laser based on image data is deflected by the rotating polygon mirror 210, and is used to perform exposure on the charged photosensitive drum 102Y (image bearing member). The laser beam deflected by the polygon mirror 210 is used to perform scanning on the photosensitive drum (exposed member). As a result, an electrostatic latent image is formed on the rotating photosensitive member. After this, the electrostatic latent image is developed as a yellow toner image by the developing device 105Y.

The yellow, magenta, cyan, and black toner images formed on the photosensitive drums 102Y, 102M, 102C, and 102Bk of the image forming units are respectively transferred to the intermediate transfer belt 107 by the primary transfer devices 111Y, 111M, 111C, and 111Bk. As a result, the toner images of the different colors are superimposed one upon the other on the intermediate transfer belt 107.

When the toner images of the four colors have been transferred to the intermediate transfer belt 107, the toner images of the four colors on the intermediate transfer belt 107 are transferred again (i.e., undergo secondary transfer) by a secondary transfer device 114 to a recording material S. The recording material S has been conveyed to a secondary transfer position from a manual feed cassette 116 or a sheet feeding cassette 117. This recording material S is conveyed by a feeding roller and conveyance roller in the manual feed tray (multi-purpose tray) 117 and a registration roller at the timing that the toner images on the intermediate transfer belt 107 are moved. And, the toner images on the recording material S are fixed through heating at a fixing device 115, so that a full-color image is obtained on the recording material S.

Residual toner is removed by the drum cleaning devices 106Y, 106M, 106C, and 106Bk from the photosensitive drums 102Y, 102M, 102C, and 102Bk that have completed transfer and the photosensitive drums are made ready for the subsequent image formation.

Next, the construction of the optical scanning devices 104Y, 104M, 104C, and 104Bk will be described with reference to FIG. 2. Since the optical scanning devices are of the same construction, the suffix letters indicating the colors, Y, M, C, and Bk, will be omitted in the following description.

Each optical scanning device 104 is equipped with a casing 200, in which various optical members described below are arranged.

The optical scanning device 104 is provided with a semiconductor laser 202 (e.g., a vertical cavity surface emitting laser (VCSEL)) serving as the light source from which a laser beam (light beam) is emitted. In the following description, the semiconductor laser 202 will be referred to as the VCSEL. The VCSEL 202 is mounted to a laser holder 201 (holding member) together with a collimator lens 205 described below. The laser holder 201 is equipped with a lens barrel portion 203, and a collimator lens 205 is mounted to the distal end of the lens barrel portion 203.

The collimator lens 205 converts the laser light (divergent light) emitted from the VCSEL 202 into parallel light. At the time of assembly of the optical scanning device 104, the installation position of the collimator lens 205 is adjusted while detecting the irradiating position and focus of the laser light emitted from the VCSEL 202, by a specific jig. When the installation position of the collimator lens 205 is determined, with ultraviolet rays an ultraviolet curing type adhesive applied between the collimator lens 205 and the lens barrel portion 203 is eradiated, so that the collimator lens 205 is bonded to the laser holder 201.

The VCSEL 202 is electrically connected to an electric circuit board 204 (hereinafter referred to as the board 204), and is caused to emit a laser beam by a drive signal supplied from the board 204. In a side wall of the casing 200, a fitting-hole portion for performing positioning on the laser holder 201 is provided. By fitting the laser holder 201 into the fitting-hole portion of the lens barrel portion 203, the laser holder 201 is positioned with respect to the casing 200. The laser holder 201 can make a minute rotation while fitted into the casing 200 so that an image-formation interval of a plurality of laser beams on the photosensitive drums in the rotating direction of the photosensitive drums (the image-formation interval of the laser beams in the sub scanning direction) is adjusted.

The laser beam having passed through the collimator lens 205 passes through a cylindrical lens 206, and enters a polygon mirror 210 (rotating polygon mirror) serving as an optical unit for guiding the laser beam to the photosensitive member to be irradiated.

The polygon mirror 210 is rotated at a fixed speed by a motor (not illustrated). The laser beam having entered the polygon mirror 210 is deflected by a reflection surface to be converted into a scanning beam, which moves on the photosensitive drum 102 in a predetermined direction. The scanning beam is converted into a scanning beam with which scanning is performed at uniform velocity on the photosensitive drum 102 by a first image forming lens 216 (first fθ lens) and a second image forming lens 217 (second fθ lens). After passing through the second image forming lens 217, the scanning beam forms an image on the photosensitive drum 102.

The optical scanning device 104 is equipped with a beam detect (BD) sensor 207 which is a synchronous detection unit. The BD sensor 207 is arranged in the movement path of the scanning light by the polygon mirror 210. By receiving the laser beam, the BD sensor 207 generates a synchronous signal. A system control unit 218 performs laser beam light quantity control (auto power control) using as a reference the timing with which the synchronous signal is generated, and laser beam output control based on image data.

In the optical scanning device 104 of the present embodiment, the laser beam having passed through the collimator lens 205 enters a half mirror 208 serving as a laser beam separation unit. The half mirror 208 divides the input laser beam into a transmission laser beam (transmission light beam) directed to the polygon mirror 210 and a reflection laser beam (reflection light beam) directed to an optical sensor 209 serving as a light receiving unit. The optical sensor 209 having received the reflection laser beam outputs a voltage signal based on the reception light quantity. The half mirror 208 is a flat-plate type half mirror in which the surface to which the laser beam is input and the surface from which the transmission laser beam is output are parallel to each other.

A system control unit 218 illustrated in FIG. 2 compares the voltage of the signal output from the optical sensor with a voltage corresponding to a target light quantity, and control the value of an electric current supplied from the board 204 to the VCSESL 202 based on the difference in voltage. More specifically, in the case where the voltage output from the optical sensor 209 is lower than the voltage corresponding to the target light quantity, the electric current supplied from the board 204 to the VCSEL 202 is increased to increase the light quantity of the laser beam.

On the other hand, in the case where the voltage of the signal output from the optical sensor 209 is higher than the voltage corresponding to the target light quantity, the electric current supplied from the board 204 to the VCSEL 202 is reduced to reduce the light quantity of the laser beam. In this way, automatic light quantity control is executed by the system control unit 218.

Figure 3A:
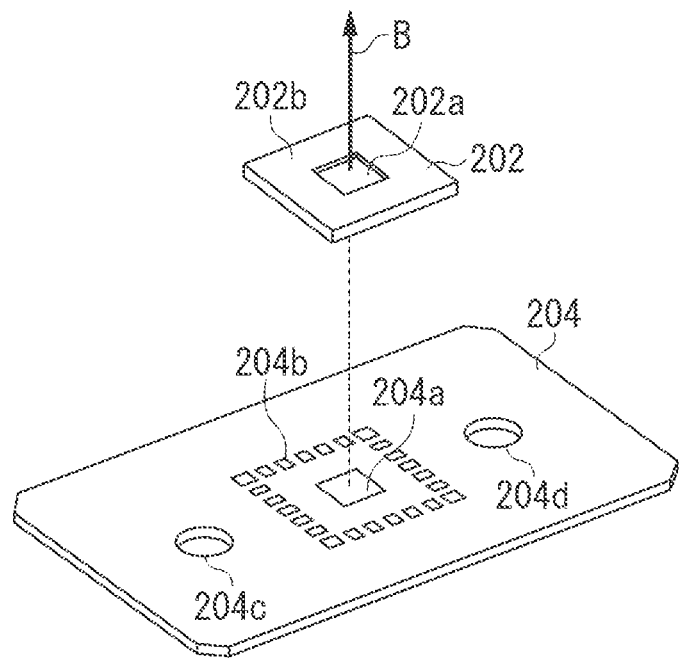
FIGS. 3A and 3B are exploded perspective views of a board and a light source.
Figure 3B:
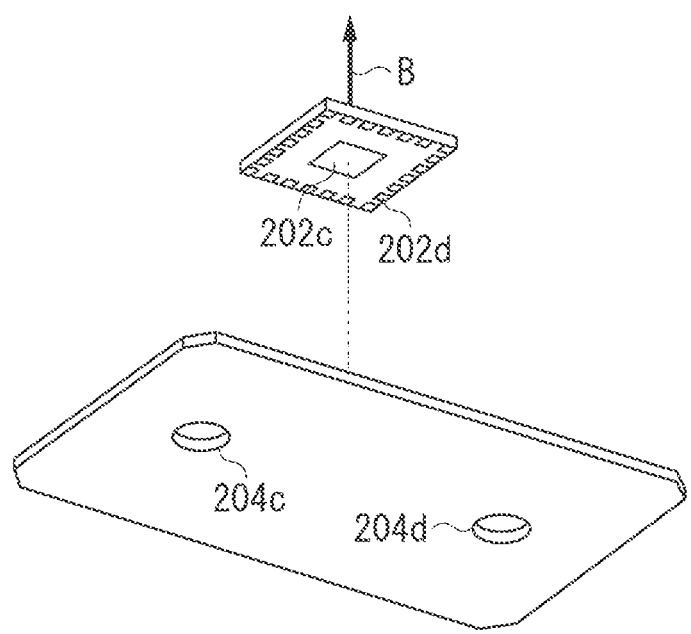
Figure 4:
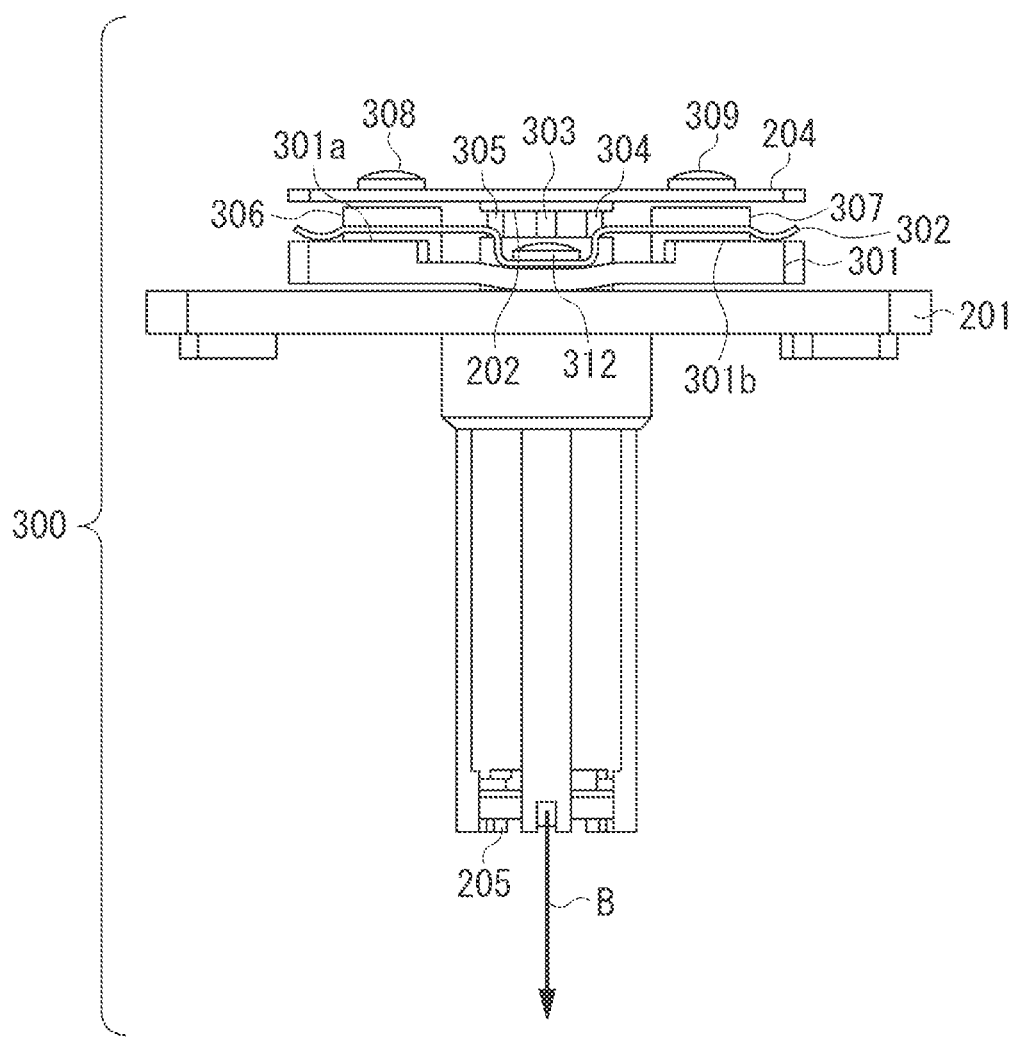
FIG. 4 is a sectional view of a light emission apparatus according to a first embodiment.
Figure 5:
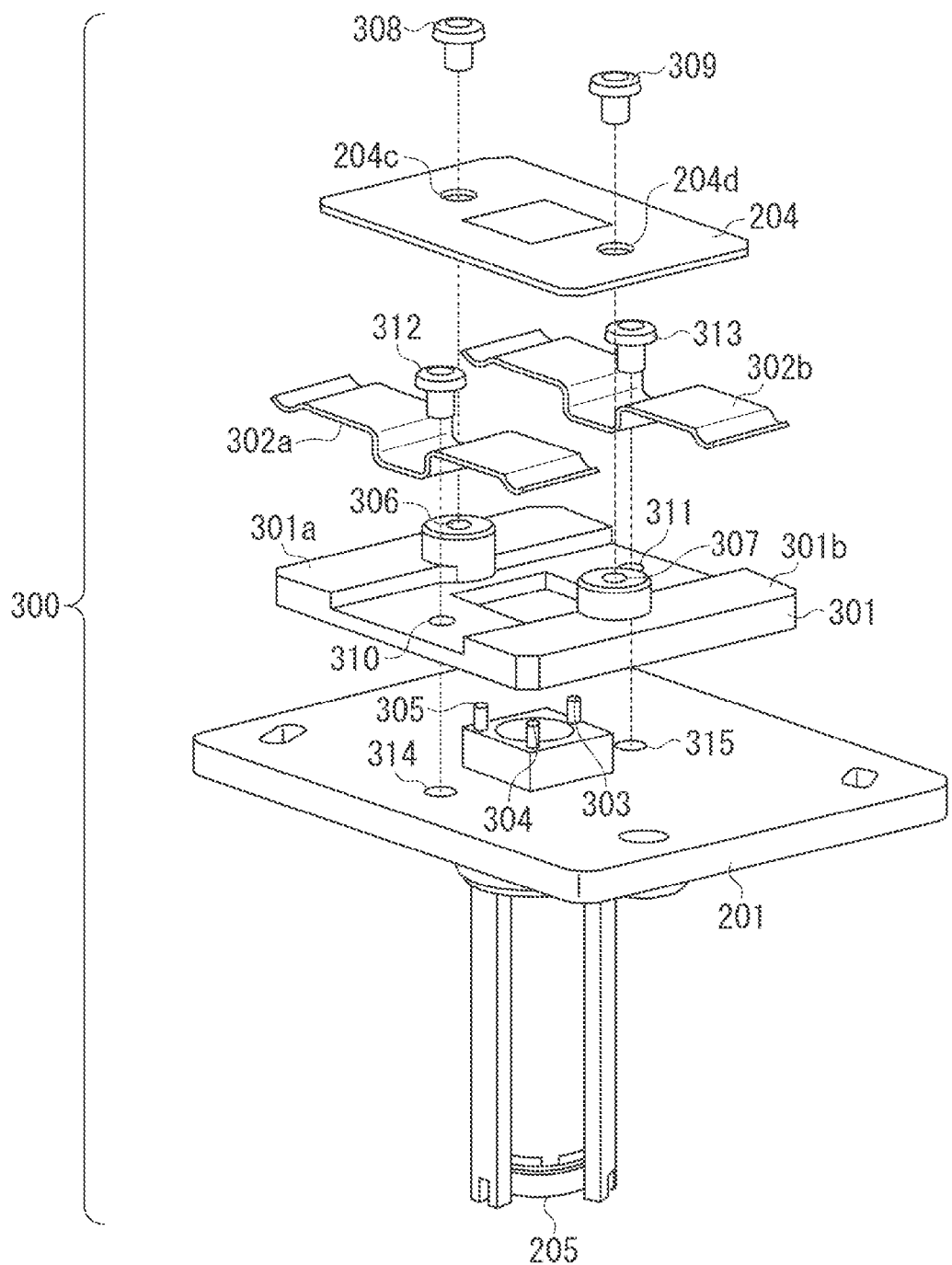
FIG. 5 is an exploded perspective view of the light emission apparatus according to the first embodiment.

Next, a light emission apparatus 300 provided in the image forming apparatus according to the present embodiment will be described with reference to FIGS. 3, 4, and 5. FIGS. 3A and 3B are exploded perspective views of the board 204 and the VCSEL 202. FIG. 4 is a sectional view of the light emission apparatus 300, and FIG. 5 is an exploded perspective view of the light emission apparatus 300.

FIGS. 3A and 3B are exploded perspective views of the VCSEL 202 and the board 204. They are shown at different angles. As illustrated in FIG. 3A, the VCSEL 202 is a chip equipped with a light emission surface 202a (light emission unit) having a plurality of light emission points, and a package 202b (package unit). On the board 204, a large electrode 204a for heat radiation and a small electrode 204b (first electrode) for an electric signal are provided.

Further, as illustrated in FIG. 3B, on the back surface of the package 202b of the VCSEL 202, a large electrode 202c for heat radiation and a small electrode 202d (second electrode) for an electric signal are provided. A large number of light emission points are formed on the light emission surface 202a of the VCSEL 202. It is necessary to individually carry out wiring for drive current for these light emission points. Such wiring is performed on the package 202b.

Generally speaking, the higher the temperature of the semiconductor laser, which is subject to the influence of temperature, the lower the light emission efficiency of the semiconductor laser including the VCSEL. In view of this, to suppress an increase in the temperature of the semiconductor laser and to maintain stable, high light emission efficiency, a relatively large electrode for heat radiation is provided on the back surface side of the light emission surface 202a of the semiconductor laser. Also on the VCSEL 202 side, a large electrode for heat radiation 202c and a small electrode for electric signal 202d (inclusive of the wiring for transmitting the electric signal) are provided, which are respectively connected by soldering to the large electrode for heat radiation 204a and the small electrode for electric signal 204b provided on the board 204. The board 204 is provided with openings 204c and 204d. They will be described in detail below.

As illustrated in FIG. 4, the light emission apparatus 300 is equipped with the VCSEL 202, the collimator lens 205, and a holding member in the form of a laser holder 201. Further, the light emission apparatus 300 is equipped with the board 204 to which the VCSEL 202 is mounted, a resin connection member 301 capable of elastic deformation, and a pressing member in the form of a plate spring 302 serving as a pressing member.

The laser holder 201 is a member configured to retain the board 204 to which the VCSEL 202 is mounted and the collimator lens 205. A drive signal (electric signal) is supplied to each light emission point from the small electrode for electric signal 204b via the small electrode for electric signal 202d of the VCSEL 202. A laser beam is emitted from the light emission surface 202a based on the supplied drive signal.

As illustrated in FIG. 4, the laser holder 201 is provided with pillar-like contact portions 303, 304, and 305 equipped with contact surfaces to be brought into contact with the package 202b. The contact surfaces of the contact portions 303, 304, and 305 can also be held in contact not with the package 202b but with the board 204. However, if the board 204 undergoes deformation (e.g., thermal deformation), there is the possibility that the relative positional relationship between the collimator lens 205 and the light emission surface 202a of the VCSEL is deviated. To uniquely determine the relative positional relationship between the collimator lens 205 and the light emission surface 202a of the VCSEL 202, it is desirable for the contact surfaces of the contact portions 303, 304, and 305 to abut on the package 202b of the VCSEL 202.

As illustrated in FIG. 5, the connection member 301 is provided with a first fastening portion 306 (first connection portion) and a second fastening portion 307 (second connection portion) having a screw hole. The first fastening portion 306 and the second fastening portion 307 have flat surfaces, which are brought into contact with the surface of the board 204. A screw 308 passes through an opening 204c provided in the board 204 to be fastened to the first fastening portion 306, and a screw 309 passes through an opening 204d provided in the board 204 to be fastened to the second fastening portion 307, so that the connection member 301 and the board 204 are connected to each other.

The connection member 301 is provided with a plurality of openings 310 and 311 serving as the third connection portion. A screw 312 passes through the opening 310 to be fastened to a screw hole 314 provided in the laser holder 201, and a screw 313 passes through the opening 311 to be fastened to a screw hole 315, so that the connection member 301 and the laser holder 201 are connected to each other. The connection member 301 is situated between the board 204 and the laser holder 201, and the board 204 and the laser holder 201 are connected to each other via the connection member 301.

Figure 6:
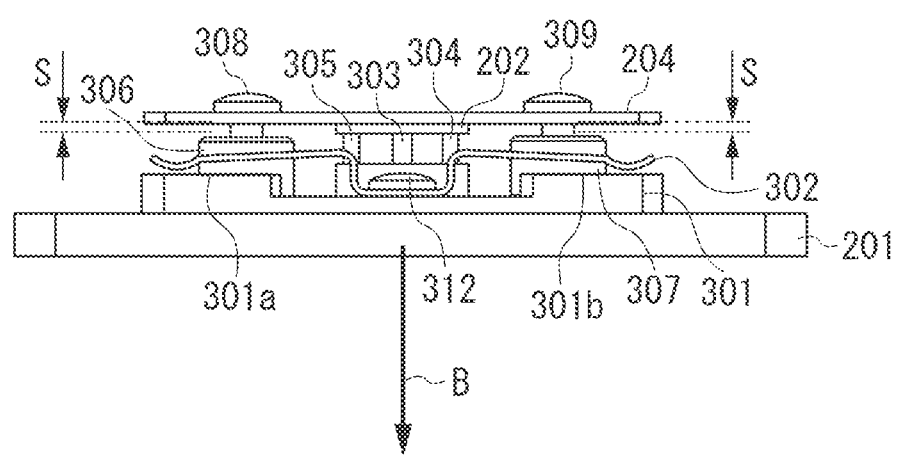
FIG. 6 is a sectional view illustrating the light emission apparatus according to the first embodiment before a board and a connection member, and the connection member and a laser holder are connected.

As illustrated in FIG. 6, the height of the contact portions 303, 304, and 305 of the laser holder 201 is such that before the fastening of the screws 308 and 309, a gap S appears between the board and the connection member 301 fixed to the laser holder 207 by a screw 312. In other words, the height of the contact portions 303, 304, and 305 of the laser holder 201 is larger than the height of a first fastening portion 306 and a second fastening portion 307, which are the portions of the connection member 301 where its thickness is maximum.

By fastening the screws 308 and 309, the first fastening portion 306 and the second fastening portion 307 of the connection member 301 undergo elastic deformation toward the board 204. Further, by fastening the screws 308 and 309, the board 204 also undergoes deformation toward the connection member 301. As a result, the gap S between the board 204 and the first fastening portion 306 and the second fastening portion 307 is filled.

In the state in which the connection member 301 is connected to the laser holder 201 and the board 204, the connection member 301 is elastically deformed into an arcuate shape. In FIG. 6, the connection portion between the laser holder 201 and the connection member 301 (the portion the screws 308 and 309 are fastened) is placed between the connection portions between the connection member 301 and the board 204 (the portion where the screws 308 and 309 are fastened), so that the connection member 301 undergoes deformation into an arcuate shape with the portion fastened by the screw 312 at the apex.

At this time, the restoring force with which the connection member 301 strives to return to the shape of FIG. 6 is transmitted to the board 204 via the screws 308 and 309. In other words, in the state of FIG. 4, a force downwardly directed as seen in FIG. 4 is applied to the board 204. With this force, the board 204 presses the package 202b of the VCSEL 202 against the contact portions 303, 304, and 305 of the laser holder 201. Thus, the board 204 presses the package 202b against the contact portions 303, 304, and 305 of the laser holder 201, so that the VCSEL 202 is fixed to the laser holder 201.

The light emission apparatus 300 is constructed such that the screw hole 314 (third fastening portion) and the screw hole 315 (fourth fastening portion) of the laser holder 201 and the first fastening portion 306 and the second fastening portion 307 of the connection member 301 are provided at positions symmetrical with respect to the beam axis B of the laser beam emitted from the VCSEL 202 or the light source (See FIG. 4), and that the line connecting the screw hole 314 and the screw hole 315 of the laser holder 201 and the line connecting the first fastening portion 306 and the second fastening portion 307 of the connection member 301 are perpendicular to each other.

The deformation of the electric circuit board will be described. Generally speaking, the coefficient of linear expansion of a glass epoxy resin used for an electric circuit board is approximately $14 \times 10^{-6}/°$ C., whereas the metal material or resin material used for the connection member 301 exhibits a coefficient of linear expansion of 20 to $100 \times 10^{-6}/°$ C., which is larger than the coefficient of linear expansion of the glass epoxy resin. In other words, the connection member 301 is more likely to undergo thermal deformation than the board 204.

When the temperature inside the image forming apparatus rises during its operation, the connection member 301 expands, and the warpage of the connection member 301 increases. The connection member 301 and the board 204 are in surface contact with each other, so that when the warpage of the connection member 301 increases, the board 204 is also warped in conformity with the warpage of the connection member 301. For example, assuming that the temperature at the time of assembly and the temperature during the operation of the image forming apparatus are 25° C. and 50° C. respectively, the difference in temperature $\Delta t$ is 25° C. Assuming that the fixation span of the board 204 and the connection member 301 is 30 mm, in the case of the temperature difference $\Delta t$ mentioned above, a difference in coefficient of linear expansion of approximately 30 μm at a maximum is generated, and warpage is generated in the board 204 having a thickness of approximately 0.5 mm.

In the light emission apparatus 300 according to the present embodiment, in order to suppress the downwardly convex deformation (warpage) of the board 204 as seen in FIG. 4, a plate spring 302 (corresponding to the plate springs 302a and 302b) is mounted, which is a pressing member configured to press the connection member 301 having undergone elastic deformation. This plate spring 302 is formed of a metal showing elasticity, and can be elastically deformed.

As illustrated in FIG. 4, the plate springs 302a and 302b are fixed to the laser holder 201 by screws 312 and 313 for fixing the connection member 301 to the laser holder 201. The plate springs 302a and 302b fixed to the connection member 301 are arranged between the connection member 301 and the board 204. The plate springs 302a and 302b are equipped with first contact portions (first pressing portions) to be brought into contact with a surface 301a on the board 204 side of the connection member 301, and second contact portions (second pressing portions) to be brought into contact with a surface 301b on the board 204 side of the connection member 301.

The plate springs 302a and 302b press the connection member 301 that has undergone elastic deformation at the first contact portion and the second contact portion. The plate springs 302a and 302b press the connection member 301 toward the laser holder 201 at positions symmetrical with respect to the beam axis B of the laser beam illustrated in FIG. 4 and at more distant positions from the beam axis B than the positions where the board 204 is fixed to the connection member 301.

In this way, the connection member 301 is pressed toward the laser holder 201 side, so that it is possible to suppress further deformation of the connection member 301, which is connected to the laser holder 201 while elastically deformed in an arcuate shape. In other words, by pressing the connection member 301 having undergone elastic deformation toward the laser holder 201 side by the plate springs 302a and 302b, it is possible to suppress movement of the first fastening portion 306 and the second fastening portion 307 toward the board side. Thus, in FIG. 4, it is possible to suppress downwardly convex deformation (curving) of the board 204, making it possible to mitigate the load on the solder connection portion where the VCSEL 202 and the board 204 are electrically connected to each other.

It is also possible to adopt a configuration in which, within the plane shown in FIG. 4, the plate springs 302a and 302b press the connection member 301 at positions nearer to the beam axis B than the fixing positions of the board 204. However, in the case where the plate springs 302a and 302b press the connection member 301 at positions nearer to the beam axis B than the fixing positions of the board 204, it is necessary to enhance the rigidity of the plate springs 302a and 302b to strike a balance between the moment generated through the warping of the connection member 301 in the direction of the board 204 and the moment generated through the pressing of the plate springs 302a and 302b. To suppress deformation of the board 204 with weak pressing force, it is desirable to adopt a configuration in which, as in the case of the present embodiment, the plate springs 302a and 302b effect the pressing at more distant positions from the beam axis B than the positions where the board 204 is fixed to the connection member 301.

Figure 10:
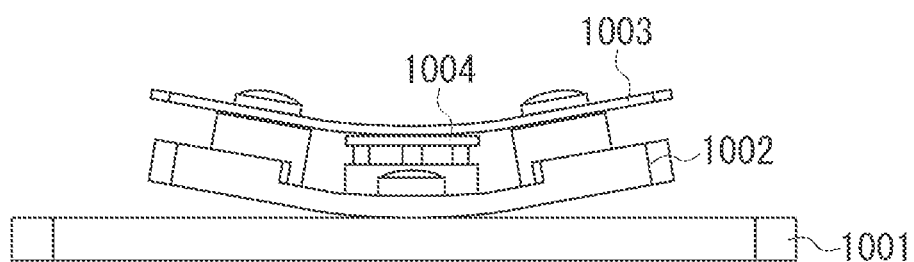
FIG. 10 is an enlarged view of a portion in the vicinity of a semiconductor laser which is provided in a conventional optical canning apparatus.

FIG. 10 is an enlarged view of a conventional light emission apparatus as a comparative example. The light emission apparatus illustrated in FIG. 10 is equipped with no plate springs 302a and 302b, so that there is generated downwardly convex deformation in the board 204 as seen in the diagram. When such deformation is generated in the board 204, a solder crack is likely to be generated in the solder which bonds the electrode provided on the board 204 and the electrode provided on the package 202b together, so that it becomes possible that a drive signal cannot be transmitted to the VCSEL 202.

In contrast, in the light emission apparatus 300 according to the present embodiment, the connection member 301 is pressed by the plate springs 302a and 302b, so that it is possible to suppress an increase in downwardly convex deformation (warpage) of the board 204 as illustrated in FIG. 10.

Figure 7A:
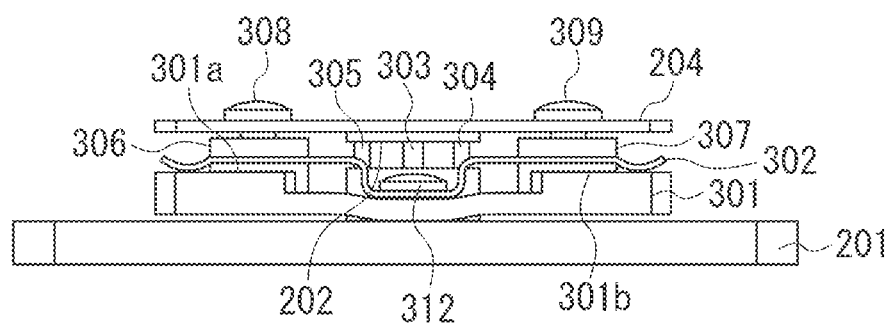
FIGS. 7A and 7B are sectional views illustrating the light emission apparatus according to the first embodiment after the board and the connection member, and the connection member and the laser holder are connected.
Figure 7B:
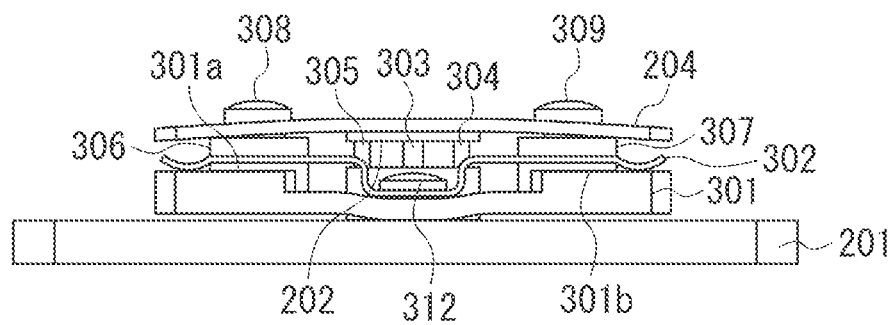

FIG. 7A is a sectional view illustrating the board 204 at the time of reduction in warpage of the board 204, and FIG. 7B is a sectional view of the light emission apparatus 300 at the time of rectification of warpage of the board 204. In the light emission apparatus 300 according to the present embodiment, it is possible to reduce the warpage of the board 204 as illustrated in FIG. 7A, or to rectify the warpage of the board 204 so as to effect warpage in the reverse direction as illustrated in FIG. 7B.

In the case where the board 204 is deformed so as to be upwardly convex as illustrated in FIG. 7B, a load is generated on the solder bonding portion electrically connecting the VCSEL 202 and the board 204. In this case, however, the board undergoes deformation such that the bonding of the solder bonding portion is compressed, so that it is unlikely that a solder crack is generated. In this way, by rectifying the warpage of the board 204 to make it hard to generate a solder crack as illustrated in FIG. 7B, it is possible to suppress generation of a solder crack.

Further, it might be possible to adopt a configuration different from the conventional technique as illustrated in FIG. 10 in which the board with the VCSEL package installed is directly fixed to the laser holder and urged toward the laser holder without using any connection member. When such a configuration is adopted, local stress on the solder bonding portion and warpage of the board will be generated. In addition, when the temperature within the image forming apparatus increases during the operation of the apparatus, this will lead to further generation of warpage of the board due to the difference in coefficient of linear expansion between the laser holder and the board.

In view of this, in the light emission apparatus 300 according to the present embodiment, as the material of the connection member 301, a material is used whose coefficient of linear expansion is somewhere between the coefficient of linear expansion of the board 204 and the coefficient of linear expansion of the laser holder 201.

Figure 8:
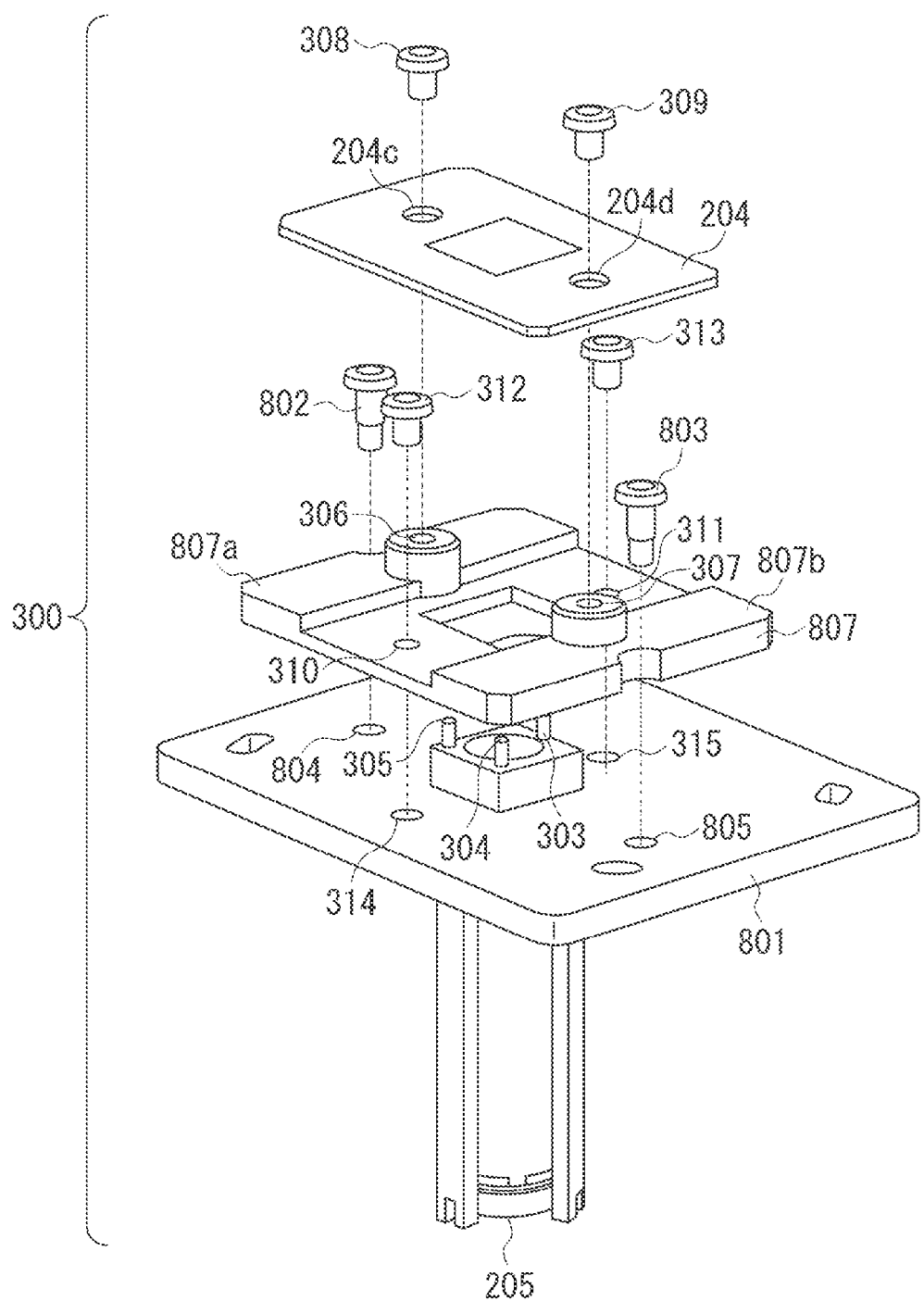
FIG. 8 is an exploded perspective view of a light emission apparatus according to a second embodiment.
Figure 9:
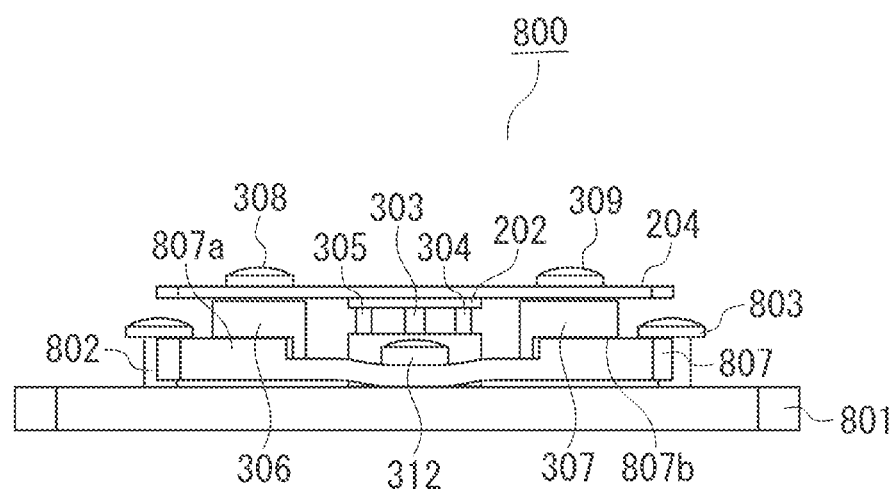
FIG. 9 is a sectional view of the light emission apparatus according to the second embodiment after the board and the connection member, and the connection member and the laser holder are connected.

A light emission apparatus 800 according to the second embodiment will be described with reference to FIGS. 8 and 9. FIG. 8 is an exploded perspective view of the light emission apparatus 800, and FIG. 9 is a front view of the light emission apparatus 800. In the second embodiment, components which are of the same construction as the first embodiment are indicated by the same reference numerals, and a description of such components will be omitted.

The light emission apparatus 800 according to the present embodiment employs stepped screws 802 and 803 as the pressing member. A laser holder 801 has a fastening portion 804 to which the stepped screw 802 is fastened, and a fastening portion 805 to which the stepped screw 803 is fastened.

After a connection member 807 has been connected and fixed to the laser holder 801 by screws, the stepped screws 802 and 803 are respectively mounted to the fastening portions 804 and 805 at the positions illustrated in FIG. 8. The fastening portions 804 and 805 provided on the laser holder 801 are mounted symmetrically with respect to the beam axis B (See FIG. 4) within the plane shown in FIG. 9, and the lower surfaces of the screw heads press the connection member 807 toward the laser holder 801 side at more distant positions from the beam axis B than the fastening portions 306 and 307.

By changing the engaging amount (fastening amount) of the stepped screws 802 and 803 with the fastening portions 804 and 805, it is possible to change the positions (height) of the screw heads of the stepped screws. The lower surface of the screw head of the stepped screw 802 presses the board 204 side surface 807a of the connection member 807, and the lower surface of the screw head of the stepped screw 803 presses the board 204 side surface 807b of the connection member 807, thereby restricting deformation of the connection member 807. This makes it possible to reduce the arcuate warpage of the connection member 807 generated at the time of fixation of the board 204, or rectify the warpage by bending in a reverse direction.

While the present invention has been described with reference to embodiments, it is to be understood that the invention is not limited to the disclosed embodiments.

This application claims priority from Japanese Patent Application No. 2011-146192 filed Jun. 30, 2011, which is hereby incorporated by reference herein in its entirety.

What is claimed is:

1. A light emission apparatus comprising:
a light emission unit including a board having a first electrode, a second electrode connected to the first electrode, and a light source configured to emit a light beam based on an electric signal transmitted from the first electrode to the second electrode;
a holding member including a contact portion contacting the light emission unit;
a connection member disposed between the board and the holding member and configured to connect the holding member and the board in an elastically deformed state, wherein the connection member includes a connection portion configured to connect the connection member to the holding member and a fastening portion to which the board is fastened with a screw such that the board is held by the connection member and the screw, the connection member is elastically deformed so that a position of the fastening portion in relation to the connection portion is changed by fastening the screw into the fastening portion, and the light emission unit connected to the connection member contacts with the contact portion of the holding member connected to the connection member, by a restoring force generated through the elastic deformation of the connection member; and
a pressing member configured to contact the connection member at a position different from the connection portion and to press the contacted connection member toward the holding member.

2. The light emission apparatus according to claim 1, wherein the connection member includes a first connection portion connected to the board, a second connection portion connected to the board at a position symmetrical with the first connection portion with respect to the light source, and a third connection portion connected to the holding member.

3. The light emission apparatus according to claim 2, wherein the restoring force generated when the connection member is elastically deformed into an arcuate shape with the third connection portion at the apex, acts on the light source via the first connection portion and the second connection portion, and the light source and the contact portion are brought into contact with each other by the force acting on the light source.

4. An optical scanning apparatus comprising:
a light emission apparatus as claimed in claim 3; and
a deflection unit configured to effect deflection such that the light beam scans an object to be scanned.

5. An image forming apparatus comprising:
an optical scanning apparatus as claimed in claim 4;
a photosensitive member serving as an object to be exposed; and
a developing unit configured to develop an electrostatic latent image formed on the photosensitive member through exposure with the light beam.

6. The light emission apparatus according to claim 2, wherein the connection member and the board are in surface contact with the first connection portion and the second connection portion.

7. The light emission apparatus according to claim 1, wherein the connection member and the pressing member are fastened to the holding member by the same screw, and wherein at least the portion of the connection member and a plate spring fastened together by the screw press the connection portion.

8. The light emission apparatus according to claim 1, wherein the pressing member is a plate spring.

9. The light emission apparatus according to claim 1, wherein the light source is a vertical cavity surface emitting laser configured to emit a laser beam as the light beam from each of a plurality of light emission points provided on the light emission unit.

10. An optical scanning apparatus according to claim 1, wherein the pressing member is configured to press a part of the connection member that is changed in the position in relation to the connection portion by the connection member being elastically deformed.

11. An optical scanning apparatus according to claim 1, wherein the pressing member is a restriction member configured to restrict an amount of change of the connection member.

12. An optical scanning apparatus according to claim 11, wherein the restriction member is a screw fastened into the holding member.

* * * * *